(12) United States Patent
Schippers

(10) Patent No.: US 10,311,919 B2
(45) Date of Patent: Jun. 4, 2019

(54) APPARATUSES AND METHODS FOR CALIBRATING SENSE AMPLIFIERS IN A SEMICONDUCTOR MEMORY

(71) Applicant: MICRON TECHNOLOGY, INC., Boise, ID (US)

(72) Inventor: Stefan Frederik Schippers, Peschiera del Garda (IT)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 15/662,059

(22) Filed: Jul. 27, 2017

(65) Prior Publication Data

US 2019/0035436 A1    Jan. 31, 2019

(51) Int. Cl.
  *G11C 7/02*  (2006.01)
  *G11C 7/08*  (2006.01)
  *G11C 14/00*  (2006.01)

(52) U.S. Cl.
  CPC ............ *G11C 7/08* (2013.01); *G11C 14/0009* (2013.01); *G11C 14/0027* (2013.01); *G11C 14/0036* (2013.01); *G11C 14/0081* (2013.01)

(58) Field of Classification Search
  CPC ......... G11C 7/08; G11C 7/06; G11C 11/1655; G11C 11/1673; G11C 14/0009; G11C 14/0036; G11C 14/0027; G11C 14/0081
  See application file for complete search history.

(56) References Cited

U.S. PATENT DOCUMENTS

| | | | |
|---|---|---|---|
| 9,203,352 B1 * | 12/2015 | Hoang | H03F 3/45475 |
| 9,406,354 B1 * | 8/2016 | Jung | G11C 7/08 |
| 9,659,623 B1 * | 5/2017 | Sadd | G11C 11/1673 |
| 2013/0170309 A1 * | 7/2013 | Chen | G11C 7/06 365/207 |
| 2017/0069368 A1 * | 3/2017 | Woo | G11C 11/4094 |
| 2017/0117028 A1 * | 4/2017 | Morton | G11C 11/1673 |

\* cited by examiner

*Primary Examiner* — Toan K Le
(74) *Attorney, Agent, or Firm* — Dorsey & Whitney LLP

(57) ABSTRACT

Apparatuses and methods for calibrating sense amplifiers in a semiconductor memory are disclosed. An example apparatus includes an amplifier circuit and a calibration circuit. The amplifier circuit is configured to be coupled to a supply voltage and a reference voltage, and when activated the amplifier circuit is configured to provide an output signal at an output that is complementary to an input signal provided to an input. When activated by a calibration signal, the calibration circuit is configured to provide a calibration voltage to the output of the amplifier circuit, wherein the calibration voltage is an equilibration voltage between the supply voltage and the reference voltage provided to the amplifier circuit.

19 Claims, 12 Drawing Sheets

APPARATUSES AND METHODS FOR CALIBRATING SENSE AMPLIFIERS IN A SEMICONDUCTOR MEMORY

BACKGROUND

High data reliability, high speed of memory access lower power consumption and reduced scaling of chip size are features that are demanded from semiconductor memory. The reduced scaling of the chip size typically results in smaller feature sizes the various circuits of semiconductor memory. For example, in a memory array included in a semiconductor memory, memory cells, access line, sense line, sense amplifiers, as well as other circuits in the memory array are designed with smaller feature sizes. The circuits with smaller feature sizes may be more susceptible to process variations which cause variations in circuit performance from ideal circuit characteristics. Lower power consumption is often achieved by using lower internal voltages, such as using lower voltages for driving internal signals, for storing in the memory cells, etc. A consequence of the reduced scaling and reduction in power consumption is that the internal signals become challenging to detect and to transmit on signal lines.

With regards to memory cells and reading information stored in the memory cells, in particular in volatile memory, such as dynamic random access memory (DRAM), the continuous scaling of semiconductor memory and reduction in power consumption has a direct impact on the design and performance of the sense amplifiers that are used to read out the information stored in the memory cells. For example, the reduction of the memory cell dimensions and the increase of interconnection parasitic capacitance and resistance may result in difficulties in accurately reading stored information.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
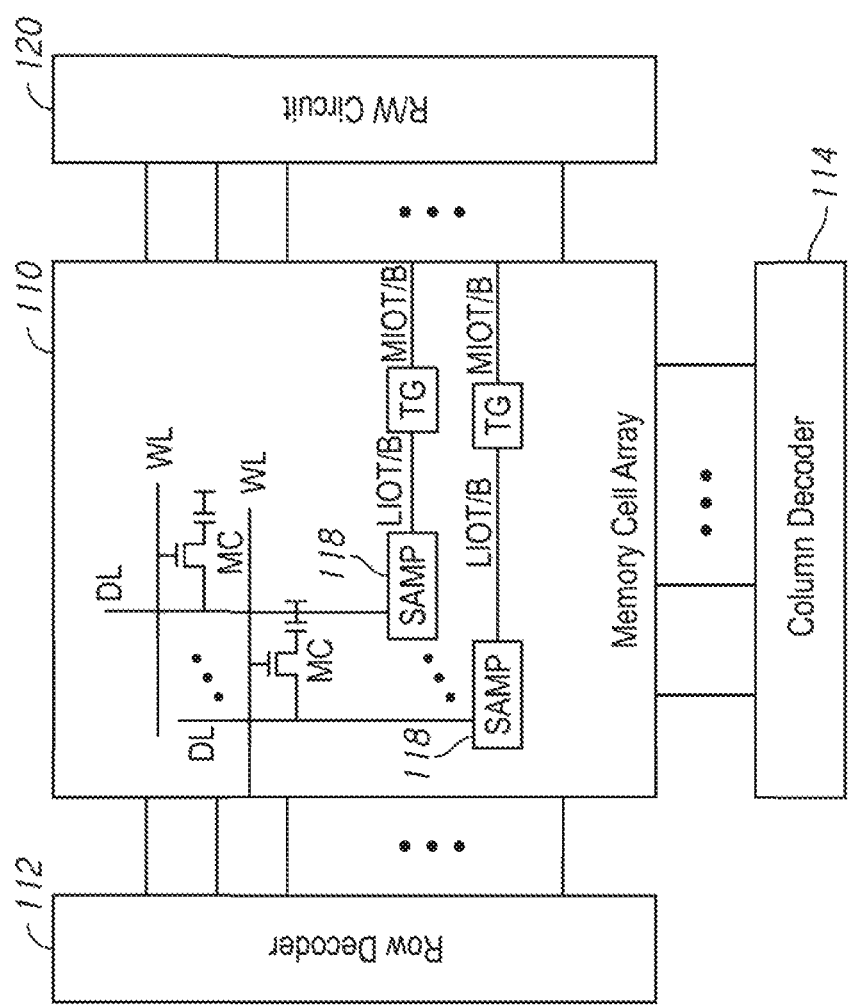
FIG. 1 is a block diagram of a portion of a semiconductor memory including a sense amplifier according to an embodiment of the disclosure.

FIG. 1 is a block diagram of a portion of a semiconductor memory in accordance with an embodiment of the present disclosure. As shown in FIG. 1, the portion shown includes a memory array 110. The memory array 110 includes a plurality of access lines WL, a plurality of sense lines DL, and a plurality of memory cells MC arranged at intersections of the plurality of access lines WL and the plurality of sense lines DL. The memory cells MC included in the memory array 110 may be, for example, volatile memory cells (e.g., DRAM memory cells, SRAM memory cells, etc.), non-volatile memory cells (e.g., flash memory cells, PCM cells, etc.), some other types of memory cells, or combinations of various memory cells. The memory array 110 may be configured as a plurality of memory banks in some embodiments of the disclosure. In accessing the memory cells MC of the memory array 110, a row decoder 112 selects the access line WL and a column decoder 114 selects the sense line DL according to row addresses and column addresses corresponding to the memory cells to be accessed. A plurality of sense amplifiers SAMP 118 are coupled to corresponding sense lines DL to sense and amplify voltages representing data stored by the memory cells MC. The sense amplifiers SAMP 118 are coupled to local I/O line pairs LIOT/B. The local IO line pairs LIOT/B are coupled to main IO line pairs MIOT/B via transfer gates TG which function as switches. The main IO line pairs MIOT/B are coupled to the read/write circuit 120, which is coupled to input and output circuits (not shown) that receive and provide data for the semiconductor memory.

Figure 2:
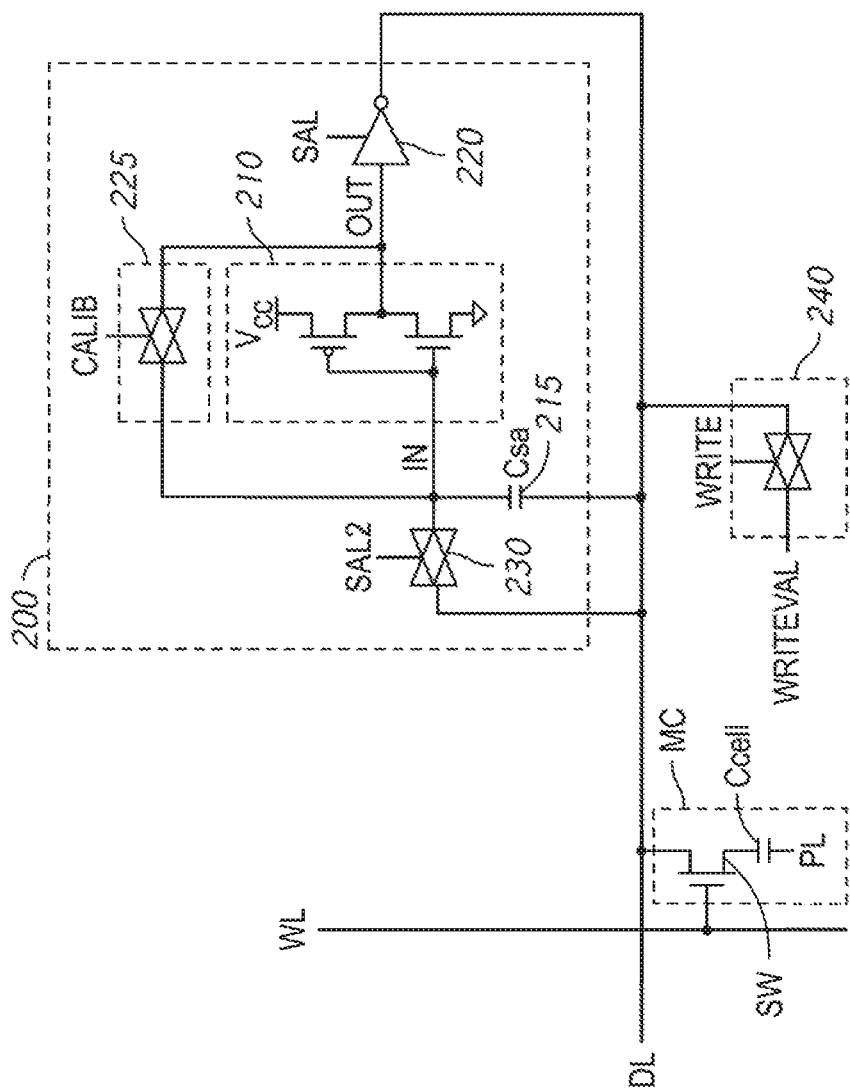
FIG. 2 is a schematic diagram of a sense amplifier according to an embodiment of the disclosure.

FIG. 2 is a schematic diagram of a sense amplifier 200 according to an embodiment of the disclosure. The sense amplifier 200 may be used as a sense amplifier 118 in the apparatus 110 of FIG. 1 in some embodiments of the disclosure. The sense amplifier 200 may be coupled to a sense line DL that is used to provide a voltage corresponding to data stored by a memory cell MC. The memory cell MC may be accessed by activating an access line WL to cause a voltage stored by the memory cell MC to be provided to the sense line DL. The voltage stored by the memory cell MC corresponds to data, for example, a first voltage corresponds to a "1" bit of data and a second voltage corresponds to a "0" bit of data. The change in voltage caused by coupling the memory cell MC to the sense line DL is sensed and amplified by a sense amplifier, for example, the sense amplifier 200.

In some embodiments of the disclosure, for example, as shown in FIG. 2, the memory cell MC may be a volatile memory cell that includes a memory cell switch SW and a memory cell capacitor CCELL. However, the scope of the disclosure is not intended to be limited to any particular type of memory cell and in other embodiments of the disclosure the memory cell MC may be different that that shown in FIG. 2. For example, other volatile memory cells, as well as non-volatile memory cells, may be used in embodiments of the disclosure. Example memory cells include, but are not limited to, memory cells including multiple transistors and/ or multiple capacitors (e.g., 2T-1C memory cells, 2T-2C memory cells, 3T-2C memory cells, etc.), floating gate memory cells, magnetic memory cells, phase change memory cells, ferroelectric memory cells, etc.

In embodiments of the disclosure including a memory cell where the data stored by the memory cell is destroyed when the memory cell is accessed (i.e., destructive read), upon completion of the sensing and amplification of the voltage provided by an activated memory cell MC, data should be "written back" to the memory cell MC before deactivating the memory cell. Data may be written back to the memory cell MC by applying a voltage to the sense line DL that corresponds to the data originally stored by the memory cell MC.

The sense amplifier 200 includes an amplifier circuit 210 and a capacitor 215 through which an input of the amplifier 210 is coupled to the sense line DL. The capacitor 215 may be implemented by any circuit known to those of ordinary skill in the art. The amplifier circuit 210 is configured to be coupled to a supply voltage (e.g., provided by a power supply VCC) and a reference voltage (e.g., reference voltage VSS). The amplifier circuit 210 receives an input signal IN having a voltage representing input data provided by the sense line DL and provides an output signal OUT having a voltage representing output data. In some embodiments of the disclosure, the amplifier circuit 210 may be implemented as an inverter circuit, for example, as shown in FIG. 2. As a result, the amplifier circuit 210 provides an output signal representing output data complementary to the input data. The amplifier circuit 210 may include other circuits in other embodiments of the disclosure.

The sense amplifier 200 further includes a calibration circuit 225. The calibration circuit 225 couples an output of the amplifier circuit 210 to its input when activated by an active calibration signal CALIB. The calibration circuit 225 may include a pass gate circuit in some embodiments of the disclosure, for example, as shown in FIG. 2. An inverter circuit 220 and pass gate circuit 230 included in the sense amplifier 200 are coupled to the input, output, and the sense line DL as a data latch circuit. The inverter circuit 220 is activated by an active latch signal SAL and the pass gate circuit 230 is activated by an active latch signal SAL2. The inverter circuit 220 provides an output signal having a logic level complementary to the output signal OUT of the amplifier circuit 210 when activated by the SAL signal, and the pass gate circuit 230 couples the input of the amplifier circuit 210 to the sense line DL when activated by the SAL2 signal.

A precharge circuit 240 precharges the sense line DL when activated by the precharge activation signal WRITE by setting a voltage of the sense line DL to a precharge voltage WRITEVAL in preparation for a sense operation by the sense amplifier 200. The precharge circuit 240 may be implemented as a pass gate circuit in some embodiments of the disclosure, for example, as shown in FIG. 2. In some embodiments, the precharge voltage is 0.6 volts, which may be one-half the supply voltage.

Figure 3A:
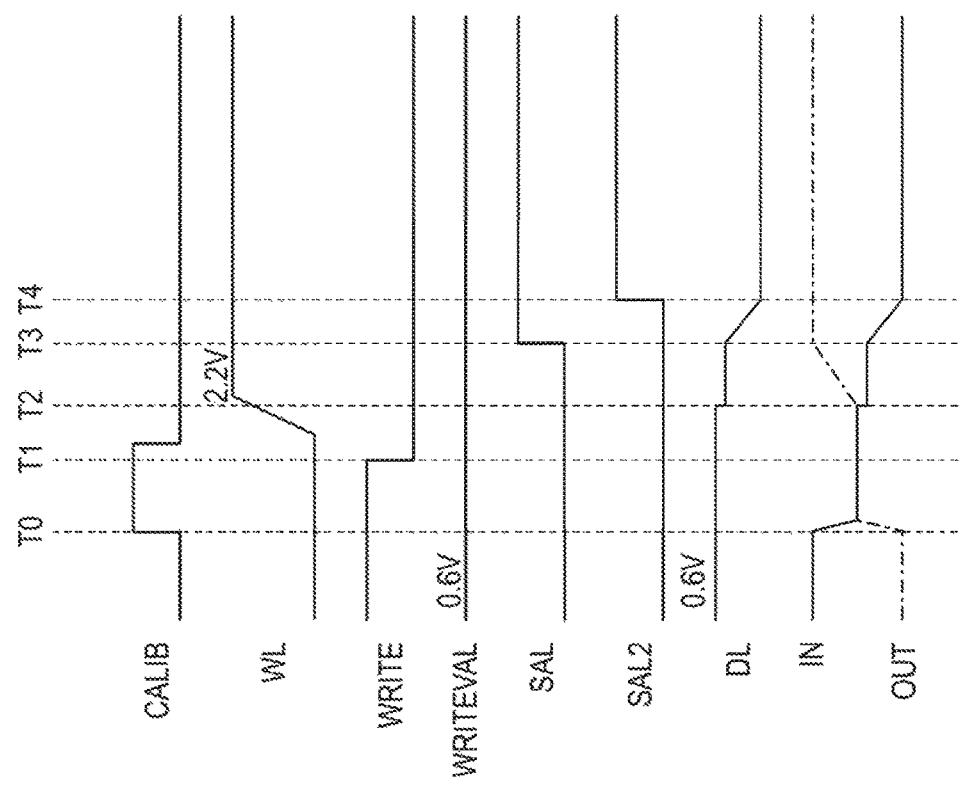
FIG. 3A is a timing diagram showing various signals during operation of the sense amplifier of FIG. 2 according to an embodiment of the disclosure.
Figure 3B:
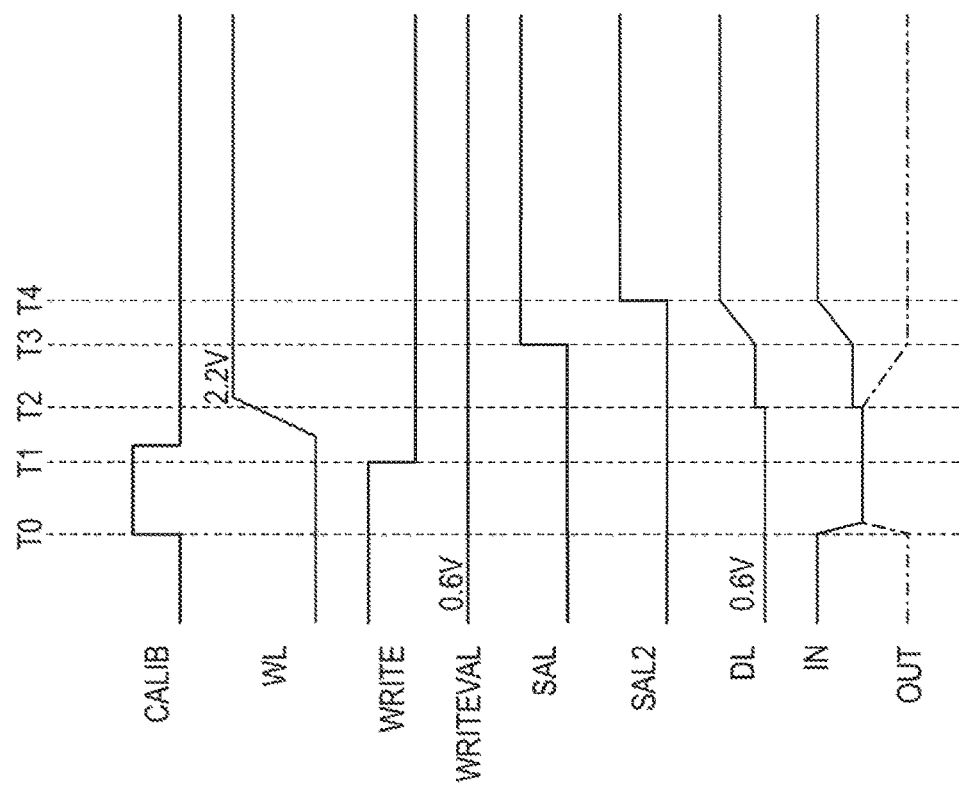
FIG. 3B is a timing diagram showing various signals during operation of the sense amplifier according to an embodiment of the disclosure.

Operation of the sense amplifier 200 will be described with reference to FIG. 2, and FIGS. 3A and 3B. FIG. 3A is a timing diagram showing various signals during operation of the sense amplifier 200 for a memory cell storing low logic level data according to an embodiment of the disclosure. FIG. 3B is a timing diagram showing various signals during operation of the sense amplifier 200 for a memory cell storing high logic level data according to an embodiment of the disclosure.

With reference to FIG. 3A, prior to time T0, the memory cell MC is deactivated by inactive access line WL, and the sense line DL is precharged to a precharge voltage. The sense line DL is precharged through the precharge circuit 240 which is activated by the active WRITE signal to provide the WRITEVAL voltage to the sense line DL. The precharge voltage WRITEVAL is shown in FIG. 3A to be 0.6 volts in the embodiment of FIG. 3A. The precharge voltage may be other voltages in other embodiments of the disclosure, however. Also prior to time T0, the calibration circuit 225, the inverter circuit 220, and the pass gate circuit 230 are deactivated, respectively, by inactive CALIB, SAL, and SAL2 signals. The voltage of the precharged sense line DL results in the amplifier circuit 210 being provided a IN signal that causes the amplifier circuit 210 to provide an OUT signal corresponding to a low logic level.

At time T0, the calibration circuit 225 is activated by an active CALIB signal to couple together the input and output of the amplifier circuit 210. The coupling of the input and output of the amplifier circuit 210 causes voltages of the input and output to equalize to an equilibration voltage between the voltages of the high and low logic levels, as shown in FIG. 3A by the IN and OUT signals. In some embodiments of the disclosure, the equilibration voltage is one-half of the supply voltage. However, it will be appreciated that the scope of the disclosure is not intended to be limited to an equilibration voltage of specifically one-half of the supply voltage. The coupling of the input and output of the amplifier circuit 210 together causes the output to be at a voltage corresponding to an equilibrium point for the amplifier circuit 210. The equilibrium point may be the condition corresponding to the maximum gain of the amplifier circuit 210. Providing the equilibration voltage to the input and the output may compensate for variations of the amplifier circuit 210 from ideal amplifier characteristics. For example, deviation from ideal amplifier characteristics due to circuit mismatch, threshold voltage variations, voltage offsets, etc. may be corrected by forcing the output of the amplifier circuit 210 to the equilibration voltage.

At time T1, the precharge circuit 240 is deactivated by the inactive WRITE signal to decouple the sense line DL from the WRITEVAL voltage. Following time T1, the calibration circuit 225 is deactivated by deactivation of the CALIB signal to decouple the input and output of the amplifier circuit 210. Following deactivation of the calibration circuit 225, the access line WL is activated to activate the memory cell MC for access. The access line WL is shown in FIG. 3A as increasing to a voltage of 2.2 volts for activation. However, other voltages may be used for an activated access line WL in other embodiments of the disclosure. Upon activation of the memory cell MC at time T2, the voltage of the sense line DL is changed by the voltage corresponding to the data stored by the memory cell MC. In FIG. 3A, the memory cell MC accessed at time T2 stores a "0" logic level, corresponding to a voltage less than the precharge voltage WRITEVAL. As a result, the activated memory cell MC causes the voltage of the sense line DL to decrease, as shown in FIG. 3A at time T2.

The decrease in the voltage of the sense line DL due to the activated memory cell MC is coupled through the capacitor 215 to cause the voltage of the IN signal for the amplifier circuit 210 to decrease. The decrease in the voltage of the IN signal causes the amplifier circuit 210 to provide an OUT signal having a voltage corresponding to a high logic level, which is complementary to the low logic level corresponding to the voltage decrease of the sense line DL.

At time T3, the inverter circuit 220 is activated by an active SAL signal to provide a voltage to the sense line DL corresponding to the low logic level, that is, the complement to the high logic level of the OUT signal provided by the amplifier circuit 210. The low logic level voltage provided by the inverter circuit 220 to the sense line DL is coupled through the capacitor 215 to cause the voltage of the IN signal to further decrease, as shown between times T3 and T4. At time T4, the pass gate circuit 230 is activated by an active SAL2 signal to provide the voltage of the sense line DL to the input of the amplifier circuit 210, as shown by the IN signal. Thus, in addition to the voltage of the sense line DL being coupled to the input of the amplifier circuit 210 through the capacitor 215, the voltage of the sense DL is coupled through the activated pass gate circuit 230 at time T4. With the inverter circuit 220 and the pass gate circuit 230 activated at times T3 and T4, the logic level of the OUT signal is latched and the voltage of the sense line DL corresponds to the data that was stored by the memory cell MC. Thus, the voltage of the sense DL may be used to write back data to the activated memory cell MC for those embodiments of the disclosure where write back is necessary.

With reference to FIG. 3B, the operation of the sense amplifier 200 is similar to that previously described with reference to FIG. 3A. However, as previously described, FIG. 3B is a timing diagram showing various signals during operation of the sense amplifier 200 for a memory cell storing high logic level data according to some embodiments of the disclosure.

The operation of the sense amplifier 200 in FIG. 3B is similar to that as described with reference to FIG. 3A through to about time T2. However, in FIG. 3B, upon activation of the memory cell MC at time T2, the voltage of the sense line DL is increased to greater than the precharge voltage WRITEVAL because of the high logic level voltage corresponding to the "1" logic level stored by the memory cell MC. As a result, the activated memory cell MC causes the voltage of the sense line DL to increase, as shown in FIG. 3A at time T2. The increase in the voltage of the sense line DL due to the activated memory cell MC is coupled through the capacitor 215 to cause the voltage of the IN signal provided to the amplifier circuit 210 to increase. The increase in the voltage of the IN signal causes the amplifier circuit 210 to provide an OUT signal having a voltage corresponding to a low logic level, which is complementary to the high logic level corresponding to the voltage increase of the sense line DL.

At time T3, the inverter circuit 220 is activated by an active SAL signal to provide a voltage to the sense line DL corresponding to the high logic level, that is, the complement to the low logic level of the OUT signal provided by the amplifier circuit 210. The high logic level voltage provided by the inverter circuit 220 to the sense line DL is coupled through the capacitor 215 to cause the voltage of the IN signal to further increase, as shown between times T3 and T4. At time T4, the pass gate circuit 230 is activated by an active SAL2 signal to provide the voltage of the sense line DL to the input of the amplifier circuit 210, as shown by the IN signal. As a result, the logic level of the OUT signal is latched and the voltage of the sense line DL corresponds to the data that was stored by the memory cell MC. Thus, the voltage of the sense line DL may be used to write back data to the activated memory cell MC for those embodiments of the disclosure where write back is necessary.

Figure 4:
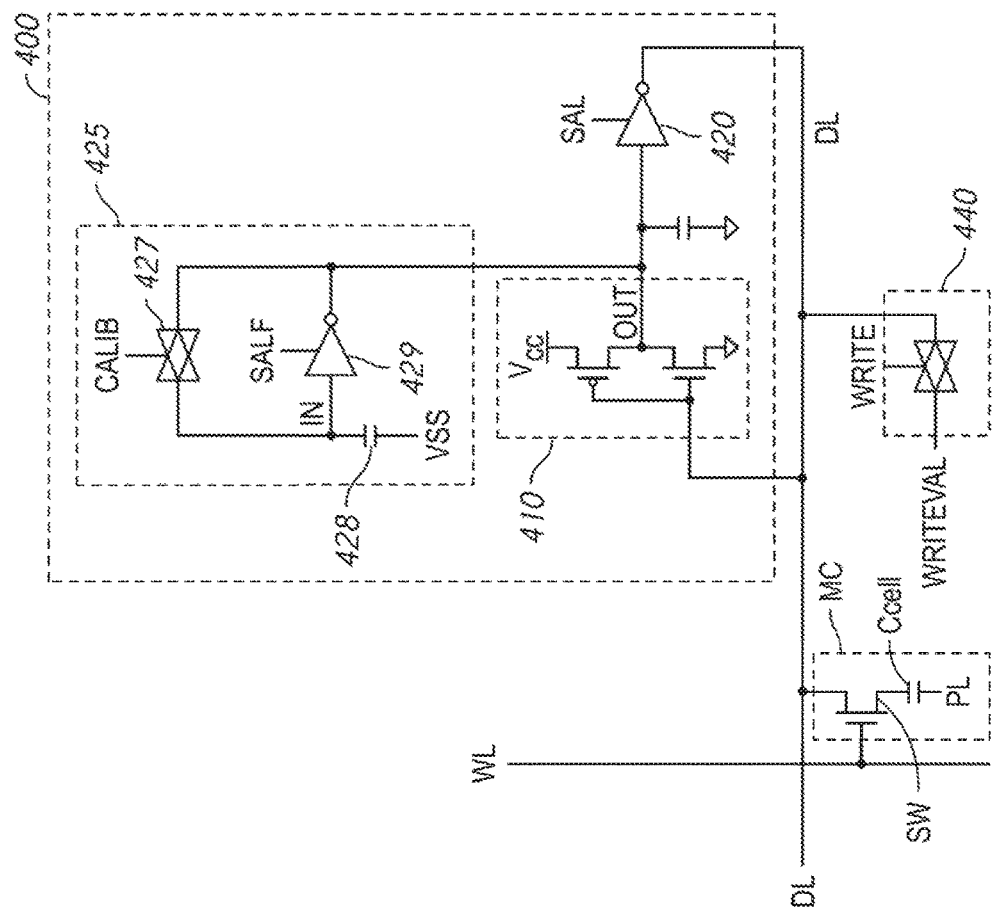
FIG. 4 is a schematic diagram of a sense amplifier according to an embodiment of the disclosure.

FIG. 4 is a schematic diagram of a sense amplifier 400 according to an embodiment of the disclosure. The sense amplifier 400 may be used as a sense amplifier 118 in the apparatus 110 of FIG. 1 in some embodiments of the disclosure. The sense amplifier 400 may be coupled to a sense line DL that is used to provide a voltage corresponding to data stored by a memory cell MC. The memory cell MC may be accessed by activating an access line WL to cause a voltage stored by the memory cell MC to be provided to the sense line DL. As previously described, the voltage stored by the memory cell MC corresponds to data, for example, a first voltage corresponds to a "1" bit of data and a second voltage corresponds to a "0" bit a data. The change in voltage caused by coupling the memory cell MC to the sense line DL is sensed and amplified by a sense amplifier, for example, the sense amplifier 400.

In some embodiments of the disclosure, for example, as shown in FIG. 4, the memory cell MC of FIG. 4 may be a volatile memory cell that includes a memory cell switch SW and a memory cell capacitor CCELL. As with the memory cell MC of FIG. 2, however, the scope of the disclosure is not intended to be limited to an particular type of memory cell and in other embodiments of the disclosure the memory cell MC may be different than that shown in FIG. 4.

The sense amplifier 400 includes an amplifier circuit 410. The amplifier circuit is configured to be coupled to a supply voltage and a reference voltage. The amplifier circuit 410 receives a signal provided by the sense line DL and provides an output signal OUT having a voltage representing output data. In some embodiments of the disclosure, the amplifier circuit 410 may be implemented as an inverter circuit, for example, as shown in FIG. 4.

The sense amplifier 400 further includes a calibration circuit 425 that is provided an input signal IN. The calibration circuit 425 includes a pass gate circuit 427 and an inverter circuit 429. The IN signal is provided to an input of the inverter circuit 429 that is coupled to a capacitor 428, which is itself coupled to a reference voltage (e.g., reference voltage VSS). The pass gate circuit 427 couples the input and output of the inverter circuit 429 when activated by an active calibration signal CALIB. The inverter circuit 429 is activated by an active SALF signal (e.g., a high logic level SALF signal). The SALF signal is the complement of the SAL signal. An inverter circuit 420 included in the sense amplifier 400 is activated by an active latch signal SAL. The inverter circuit 420 provides an output having a logic level complementary to the output signal of the amplifier circuit 410 when activated by the SAL signal.

In contrast to the sense amplifier 200 of FIG. 2, the input of the amplifier circuit 410 of the sense amplifier 400 is not coupled to the sense line DL through a capacitor. The sense amplifier 400 may be used when it is desirable for a capacitor to not be used to couple the sense line DL to the input of the amplifier circuit.

A precharge circuit 440 precharges the sense line DL when activated by the precharge activation signal WRITE by setting a voltage of the sense line DL to the precharge voltage WRITEVAL in preparation for a sense operation by the sense amplifier 400. The precharge circuit 440 may be implemented as a pass gate circuit in some embodiments of the disclosure, for example, as shown in FIG. 4. As previously described, in some embodiments of the disclosure, the precharge voltage is 0.6 volts, which may be one-half the supply voltage. Other voltage values may be used in other embodiments of the disclosure.

Figure 5:
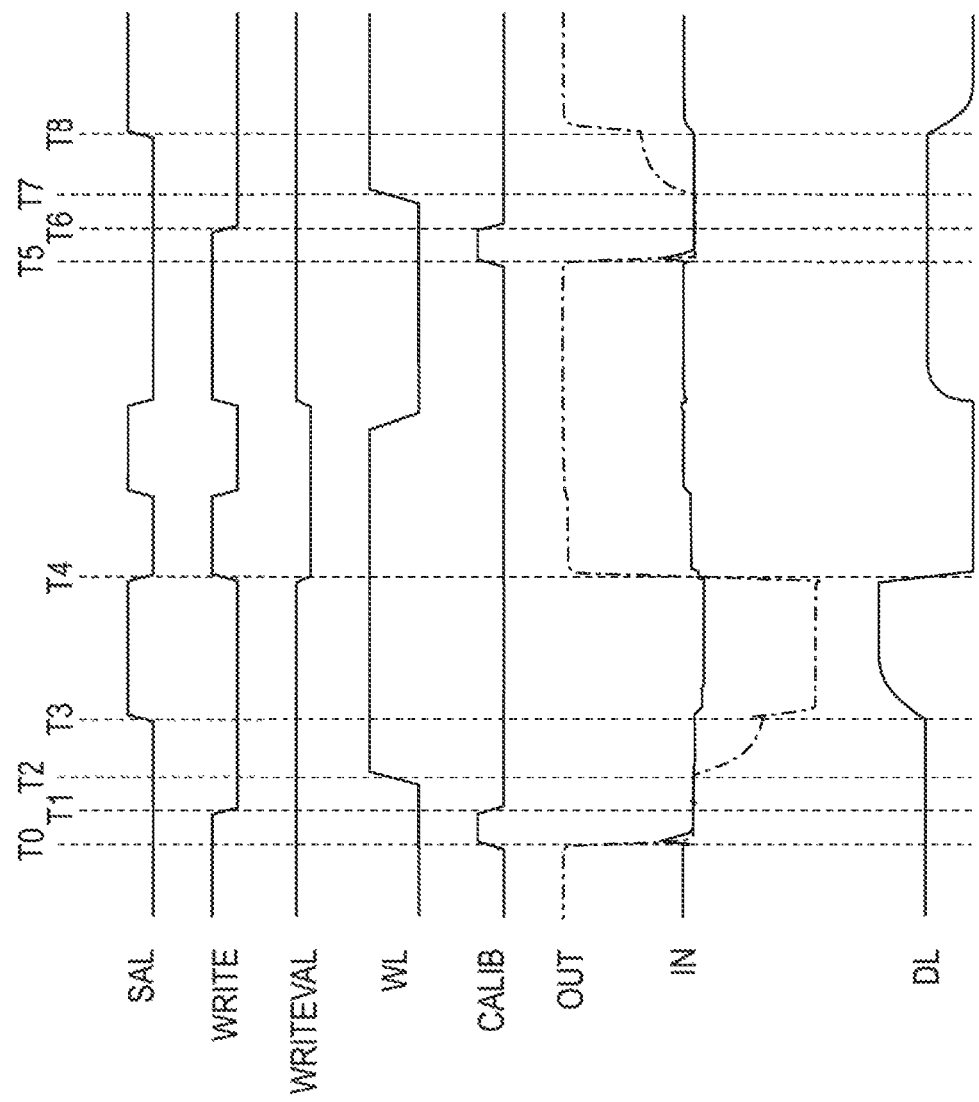
FIG. 5 is a timing diagram showing various signals during operation of the sense amplifier of FIG. 4 according to an embodiments of the disclosure.

Operation of the sense amplifier 400 will be described with reference to FIGS. 4 and 5. FIG. 5 is a timing diagram showing various signals during operation of the sense amplifier 400 according to an embodiment of the disclosure.

With reference to FIG. 5, prior to time T0, the memory cell MC is deactivated by inactive access line WL, and the sense line DL is precharged to a precharge voltage. The sense line DL is precharged through the precharge circuit 440 which is activated by the active WRITE signal to provide the WRITEVAL voltage to the sense line DL. The precharge voltage WRITEVAL is shown in FIG. 5 to be 0.6 volts in the embodiment of FIG. 5. The precharge voltage may be other voltages in other embodiments of the disclosure, however. Also prior to time T0, the inverter circuit 420 is deactivated by an inactive SAL signal. While the pass gate circuit 427 of the calibration circuit 425 is deactivated by an inactive CALIB signal, the inverter circuit 429 of the calibration circuit 425 is activated by an active SALF signal (i.e., the complement to the inactive SAL signal). As a result, the voltage of the IN signal applied to the input of the inverter circuit 429 causes the inverter circuit 429 to provide a high logic level output signal. The high logic level output signal of the inverter circuit 429 is provided to the output of the amplifier circuit 410, as shown in FIG. 5 by a high logic level OUT signal. The input of the amplifier circuit 410 is provided the WRITEVAL voltage from the precharge sense line DL.

At time T0, the pass gate circuit 427 of the calibration circuit 425 is activated by an active CALIB signal to couple together the input and output of the inverter circuit 429. The coupling of the input and output of the inverter circuit 429 causes the voltages at the input and output of the inverter circuit 429 to equalize to an equilibration voltage between the low logic level voltage and the high logic level voltage, as shown in FIG. 5 by the IN and OUT signals. In some embodiments of the disclosure, the equilibration voltage is one-half of the supply voltage. However, it will be appreciated that the scope of the disclosure is not intended to be limited to an equilibration voltage of specifically one-half of the supply voltage. The resulting voltage of the input and output of the inverter circuit 429 is provided to the output of the amplifier circuit 410. The coupling of the input and output of the inverter circuit 429 and providing the resulting voltage to the output of the amplifier circuit 410 causes the output to be at a voltage corresponding to an equilibrium point for the amplifier circuit 410. As previously described, the equilibrium point may be the condition corresponding to the maximum gain of the amplifier circuit 410. Providing the equilibration voltage to the output may compensate for variations of the amplifier circuit 410 from ideal amplifier characteristics. For example, deviation from ideal amplifier characteristics due to circuit mismatch, threshold voltage variations, voltage offsets, etc. may be corrected by forcing the output of the amplifier circuit 410 to the equilibration voltage.

At time T1, the precharge circuit 440 is deactivated by the inactive WRITE signal to decouple the sense line DL from the WRITEVAL voltage. Following time T1, the pass gate circuit 427 is deactivated by deactivation of the CALIB signal to decouple the input and output of the inverter circuit 429. Although with the pass gate circuit 427 deactivated and the output and input of the inverter circuit 429 decoupled, the voltage at the input is maintained by the capacitor coupled between the input and the reference voltage, which in turn causes the voltage at the output of the inverter circuit 429 to be maintained. Following deactivation of the pass gate circuit 427, the access line WL is activated to activate the memory cell MC for access. Upon activation of the memory cell MC at time T2, the voltage of the sense line DL is changed by the voltage corresponding to the data stored by the memory cell MC. At time T2, the memory cell MC accessed stores a "1" logic level, corresponding to a voltage greater than the precharge voltage WRITEVAL. As a result, the activated memory cell MC causes the voltage of the sense line DL to increase. The increase in the voltage of the sense line DL due to the activated memory cell MC is provided to the input of the amplifier circuit 410. The increase in the voltage of the DL sense line causes the amplifier circuit 410 to provide a complementary OUT signal having a decreasing voltage corresponding to a low logic level.

At time T3, the inverter circuit 420 is activated by an active SAL signal to provide a voltage to the sense line DL corresponding to a high logic level, that is, the complement to the low logic level of the OUT signal provided by the amplifier circuit 410. The high logic level voltage provided by the inverter circuit 420 to the sense line DL causes the voltage of the sense line DL to increase, as shown between times T3 and T4. The increasing voltage of the sense line DL is provided to the amplifier circuit 410, which further drives the OUT signal to the low logic level, as shown between times T3 and T4. Activation of the inverter circuit 420 at time T3 causes the data stored by the memory cell MC to be latched and the resulting voltage of the sense line DL may be used to write back data to the activated memory cell MC for those embodiments of the disclosure where write back is necessary. At time T4, the inverter circuit 420 is deactivated by an inactive SAL signal, and additionally, the inverter circuit 429 of the calibration circuit 425 is activated by an active SALF signal (i.e., the complement to the inactive SAL signal) to provide a high logic level output signal. The output of the amplifier circuit 410 is provided the high logic level output signal from the inverter circuit 429, as shown in FIG. 5 at time T4.

Operation of the sense amplifier 400 was previously described for a memory cell storing high logic level data. Operation of the sense amplifier 400 will also be described with reference to FIG. 5 for a memory cell storing low logic level data.

Prior to time T5, the memory cell MC is deactivated and the sense line DL is precharged to the precharge voltage WRITEVAL. Also prior to time T5, the inverter circuit 420 is deactivated by an inactive SAL signal and the inverter circuit 429 of the calibration circuit 425 is activated by an active SALF signal (i.e., the complement to the inactive SAL signal). As a result, the voltage of the IN signal applied to the input of the inverter circuit 429 through the capacitor 428 causes the inverter circuit 429 to provide a high logic level output signal. The high logic level output signal of the inverter circuit 429 is provided to the output of the amplifier circuit 410, as shown in FIG. 5 by a high logic level OUT signal. The input of the amplifier circuit 410 is provided the WRITEVAL voltage from the precharged sense line DL.

At time T5, the pass gate circuit 427 of the calibration circuit 425 is activated by an active CALIB signal and the voltages at the input and output of the inverter circuit 429 equalize to the equilibration voltage between the low logic level voltage at the input and the high logic level voltage at the output. The resulting voltage of the input and output of the inverter circuit 429 is provided to the output of the amplifier circuit 410. At time T6, the precharge circuit 440 is deactivated by the inactive WRITE signal to decouple the sense line DL from the WRITEVAL voltage, and the pass gate circuit 427 is deactivated by the deactivation of the CALIB signal to decouple the input and output of the inverter circuit 429. While the pass gate circuit 427 is deactivated, the voltage at the input of the inverter circuit 429 is maintained by the capacitor coupled between the input and the reference voltage, and the voltage at the output of the inverter circuit 429 is maintained by the input voltage. Following the deactivation of the pass gate circuit 427, the access line WL is activated to activate the memory cell MC for access. Upon activation of the memory cell MC at time T7, the voltage of the sense line DL is changed by the voltage corresponding to the data stored by the memory cell MC. At time T7, the memory cell MC accessed stores a "0" logic level, corresponding to a voltage less than the precharge voltage WRITEVAL, which causes the voltage of the sense line DL to decrease. The decrease in the voltage of the sense line DL is provided to the input of the amplifier circuit 410. The decrease in the voltage of the DL sense line causes the amplifier circuit 410 to provide a complementary OUT signal having an increasing voltage corresponding to a high logic level.

At time T8, the inverter circuit 420 is activated by an active SAL signal to provide a voltage to the sense line DL corresponding to a low logic level, that is, the complement to the high logic level of the OUT signal provided b the amplifier circuit 410. The low logic level voltage provided by the inverter circuit 420 to the sense line DL causes the voltage of the sense line DL to decrease, as shown at time T8. The decreasing voltage of the sense line DL is provided to the amplifier circuit 410, which further drives the OUT signal to the high logic level, as shown at time T8. Activation of the it circuit 420 at time T8 causes the data stored by the memory cell MC to be latched and the resulting voltage of the sense line DL may be used to write back data to the activated memory cell MC for those embodiments of the disclosure where write back is necessary.

Figure 6:
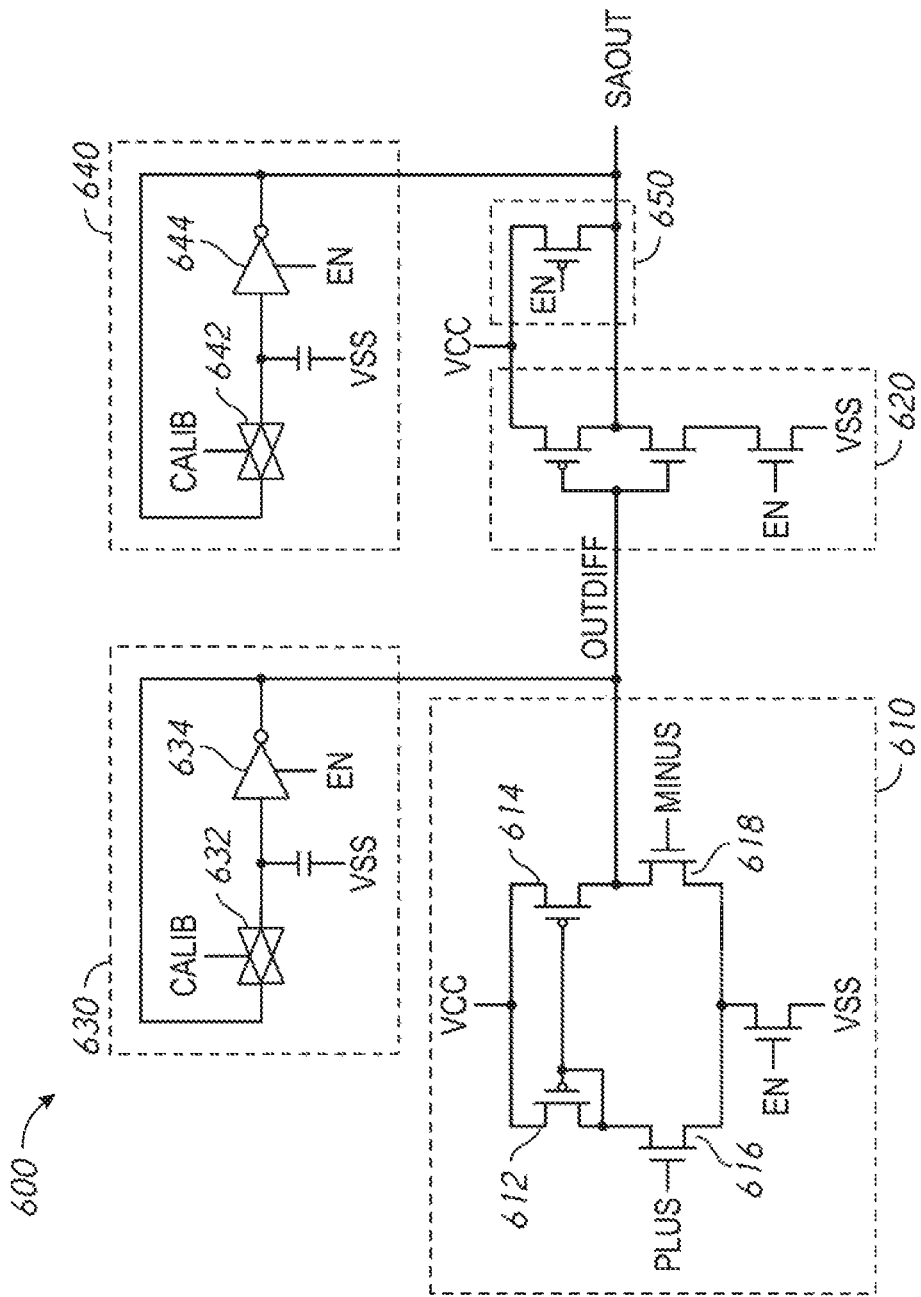
FIG. 6 is a schematic diagram of a sense amplifier according to an embodiment of the disclosure.

FIG. 6 is a schematic diagram of a sense amplifier 600 according to an embodiment of the disclosure. The sense amplifier 600 includes a differential amplifier 610 that receives a first input signal PLUS at a first input and further receives a second input signal MINUS at a second input. In some embodiments, the first input is provided a read reference voltage and the second input is coupled to a sense line DL. When activated by an active enable signal EN, the differential amplifier 610 provides an output signal OUTDIFF at an output that has a voltage based on the difference between the voltages at the first and second input signals. Data of a memory cell MC may be sensed and amplified by comparing the read reference voltage provided to the first input to the voltage of the sense line coupled to the second input and to which an activated memory cell is coupled. The differential amplifier 610 includes transistors 612 and 614 coupled as a current mirror circuit, and further includes an input transistor 616 that receives the PLUS signal and an input transistor 618 that receives the MINUS signal. The sense amplifier 600 further includes a buffer circuit 620. The buffer circuit 620 receives the OUTDIFF signal from the differential amplifier 610, and when activated by an active EN signal, provides an output signal SAOUT that is the complement of the OUTDIFF signal. The buffer circuit 620 includes an inverter circuit that may be enabled by an active EN signal.

Calibration circuits 630 and 640 included in the sense amplifier 600 are coupled to the output of the differential amplifier 610 and the output of the buffer circuit 620, respectively. The calibration circuit 630 includes a pass gate circuit 632 and an inverter circuit 634. The calibration circuit 640 likewise includes a pass gate circuit 642 and an inverter circuit 644. The inverter circuit 634 provides an output that is the complement of the input when activated by an active EN signal. When deactivated by an inactive EN signal, the inverter circuit 634 provides a high logic level voltage due to its input being coupled to a reference voltage (e.g., ground) through a capacitor. The pass gate circuit 632 couples together the output and input of the inverter circuit 634 when activated by an active calibration signal CALIB. Similarly, the inverter circuit 644 provides an output that is the complement of the input when activated by an active EN signal and provides a high logic level voltage when deactivated by an inactive EN signal. The pass gate circuit 642 couples together the output and input of the inverter circuit 644 when activated by an active CALIB signal. In some embodiments, the calibration circuit 640 is not included. In such embodiments, the buffer circuit 620 may be operated without compensation provided by the calibration circuit 640.

A pull-up circuit 650 may be included in the sense amplifier 600 in some embodiments of the disclosure. The pull-up circuit 650 may provide the output of the buffer circuit 620 a supply voltage (e.g., VCC voltage) when activated by an active ENF signal (i.e., the complement of the EN signal). While the pull-up circuit 650 is not included in some embodiments of the disclosure, the pull-up circuit 650 may be included to set the output of the buffer circuit 620 to a known voltage when the sense amplifier 600 deactivated (i.e., an inactive EN signal and an active ENF signal).

Figure 7:
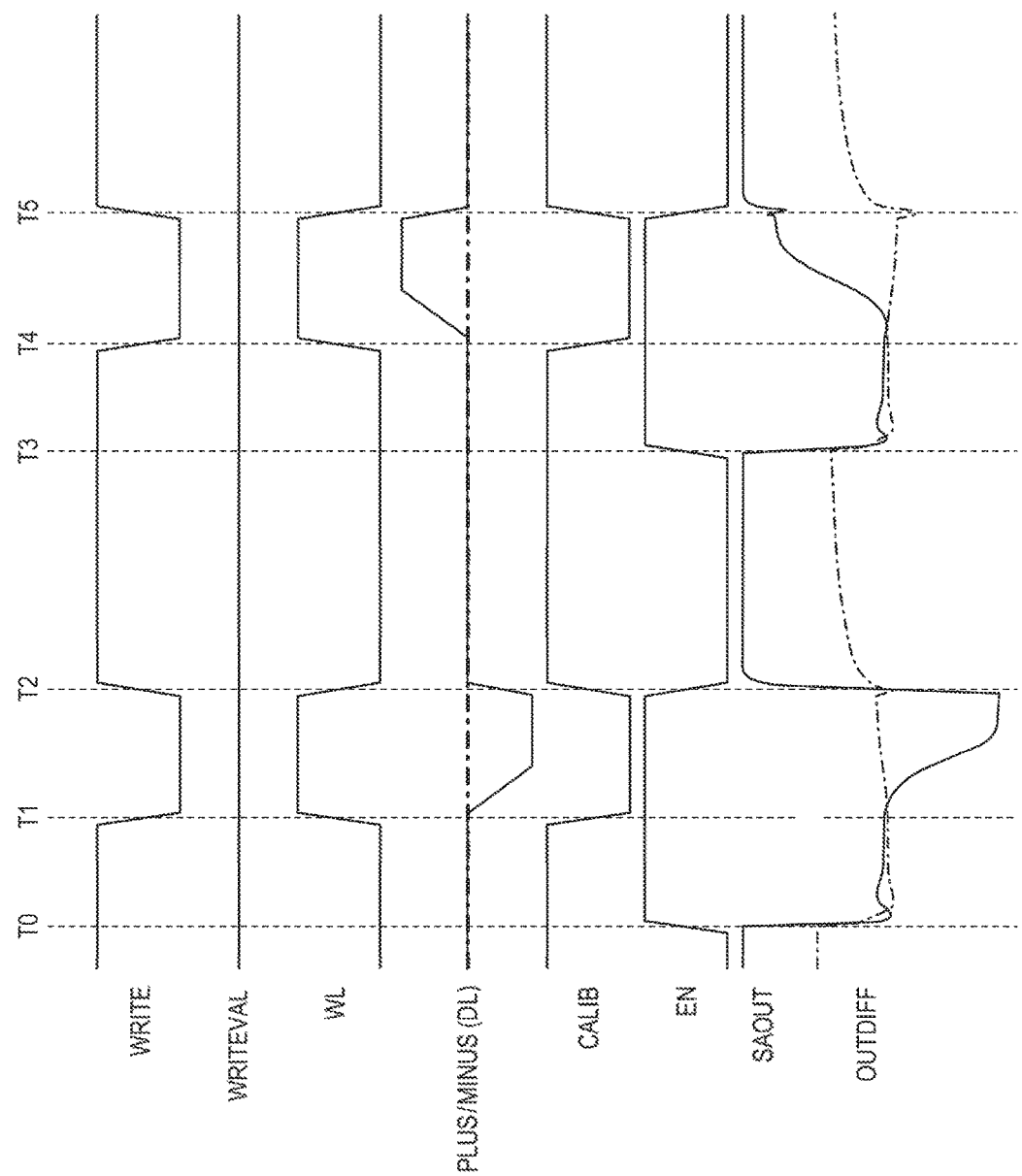
FIG. 7 is a timing diagram showing various signals during operation of the sense amplifier of FIG. 6 according to an embodiment of the disclosure.

Operation of the sense amplifier 600 will be described with reference to FIGS. 6 and 7. FIG. 7 is a timing diagram showing various signals during operation of the sense amplifier 600 according to an embodiment of the disclosure.

As previously described, in some embodiments, the first input (e.g., PLUS input) is provided a read reference voltage and the second input (e.g., MINUS input) is coupled to a sense DL. Data of a memory cell MC may be sensed and amplified by activating a corresponding access line WL to couple the memory cell MC to the sense line DL. The coupling of the memory cell MC to the sense DL may cause a change in a voltage of the sense line DL. The resulting voltage of the sense line DL may be compared with the read reference voltage provided to the first input and the voltage difference amplified by the sense amplifier 600. With reference to FIG. 7, prior to time T0, the memory cell MC is deactivated by an inactive access line WL and the sense line DL coupled to the second input of the differential amplifier 610 is precharged to a precharge voltage. The sense line DL is precharged through a precharge circuit which is activated by the WRITE signal to provide a precharge voltage (e.g., the WRITEVAL voltage) to the sense line DL. The precharge voltage WRITEVAL is shown in FIG. 7 to be 0.6 volts in the embodiment of FIG. 7. The precharge voltage may be other voltages in other embodiments of the disclosure, however. Also prior to time T0, the differential amplifier 610, the buffer circuit 620, and the inverter circuits 634 and 644 of the calibration circuits 630 and 640 are deactivated by an inactive EN signal. The first and second inputs of the differential amplifier 610 are coupled together to have the same voltage, which is the WRITEVAL recharge voltage. The pull-up circuit 650, however, is activated by the inactive EN signal (i.e., active ENF signal) to provide the supply voltage (e.g., a VCC voltage) to the output of the buffer circuit, as shown in FIG. 7.

The pass gate circuits 632 and 642 of the calibration circuits 630 and 640 are activated by an active CALIB signal to couple the input and output of the inverter circuit 634 and couple the input and output of the inverter 644. As previously discussed, the inverter circuits 634 and 644 provide a high logic level output when deactivated by an inactive EN signal. With the pass gate circuits 632 and 642 activated and the inverter circuits 634 and 644 deactivated, the voltage of the input and output are set to the supply voltage reduced by a voltage drop across a pull up transistor of the inverter circuits. The resulting voltage of the input and output of the inverter circuit 634 is provided to the output of the differential an circuit 610. The resulting voltage of the input and output of the inverter circuit 644 is provided to the output of the buffer circuit 620. The output of the buffer circuit 620, however, is provided the supply voltage by the activated pull-up circuit 650, which is activated by an inactive EN signal.

At time T0, the pull-up circuit 650 is deactivated, and the differential amplifier 610, the buffer circuit 620, and the inverter circuits 634 and 644 of the calibration circuits 630 and 640 are activated by an active EN signal. With the inverter circuits 634 and 644 of the calibration circuits 630 and 640 activated, and the pass gate circuits 632 and 642 still activated by the active CALIB the voltage provided at the outputs of the inverter circuits 634 and 644 equalize at a voltage between the low logic level voltage and the high logic level voltage (e.g., one-half the voltage difference between VSS and VCC). The resulting voltage at the output of the inverter circuit 634 is provided to the output of the differential amplifier 610 and the resulting voltage at the output of the inverter circuit 644 is provided to the output of the buffer circuit 620.

Activating the calibration circuits 630 and 640 and providing the resulting voltage to the output of the amplifier circuit 610 causes the output to be at a voltage corresponding to an equilibrium point for the amplifier circuit 610 and for the buffer circuit 620. As previously described, the equilibrium point may be the condition corresponding to the maximum gain of the amplifier circuit 610. Similarly, the equilibrium point may be the condition corresponding to the maximum gain of the amplifier circuit 610. Providing the equilibration voltage to the output of the amplifier circuit 610 and the buffer circuit 620 may compensate for variations of the amplifier circuit 610 and the buffer circuit 620 from ideal circuit characteristics. For example, deviation from ideal circuit characteristics due to circuit mismatch, threshold voltage variations, voltage offsets, etc. may be corrected by forcing the output of the amplifier circuit 610 and the buffer circuit 620 to the equilibration voltage. As previously discussed, in some embodiments, the calibration circuit 640 may not be included and the buffer circuit 620 may be operated without being calibrated as previously discussed.

At time T1, the pass gate circuits 632 and 642 are deactivated by the CALIB signal becoming inactive to decouple the inputs and outputs of the inverter circuits 634 and 644. Additionally, the first and second inputs of the differential amplifier 610 are decoupled from one another so that the second input receives a voltage from the sense line DL and the first input receives the read reference voltage. The precharge circuit is deactivated by the inactive WRITE signal to decouple the sense line DL from the WRITEVAL voltage and to allow the voltage of the sense line DL to be affected by a voltage corresponding to the data stored by a memory cell MC. Following the deactivation of the pass gate circuits 632 and 642 and decoupling of the first and second inputs, the access line WL is activated thereby activating the memory cell MC for access. Upon activation of the memory cell MC, the voltage at the second input of the differential amplifier 610 is changed by the voltage corresponding to the data stored by the memory cell MC. At time T1, the memory cell MC accessed stores a "0" logic level, corresponding to a voltage less than the precharge voltage. As a result, the activated memory cell MC causes the voltage at the second input of the differential amplifier 610 (i.e., the MINUS signal) to decrease, as shown in FIG. 7. The decrease in the voltage of the MINUS signal provided to the second input of the differential amplifier 610 causes the differential amplifier 610 to provide a complementary OUTDIFF signal having an increasing voltage. The increasing voltage of the OUTDIFF signal causes the activated buffer circuit 620 to provide a complementary SAOUT signal corresponding to a low logic level voltage, as shown in FIG. 7 between times T1 and T2. The resulting voltage provided by the activated buffer circuit 620 may be used to write back data to the activated memory cell MC for those embodiments of the disclosure where write back is necessary.

At time T2, the memory cell MC is deactivated by an inactive WL line and the pass gate circuits 632 and 642 are activated by an active CALIB signal. Also at time T2 the differential amplifier 610, the buffer circuit 620, and the inverter circuits 634 and 644 of the calibration circuits 630 and 640 are deactivated, and the pull-up circuit 650 is also activated by an inactive EN signal. The precharge circuit is also activated by an active WRITE signal to precharge the sense line DL to the WRITEVAL precharge voltage, and the first and second inputs of the differential amplifier 610 are coupled together to have the same voltage, which is the WRITEVAL precharge voltage of the sense line DL.

Operation of the sense amplifier 600 was previously described for a memory cell storing low logic level data. Operation of the sense amplifier 600 will also be described with reference to FIG. 7 for a memory cell MC storing high logic level data.

Prior to time T3, the sense amplifier 600 is in the same condition as prior to time T0 previously described. At time T3, the pull-up circuit 650 is deactivated, and the differential amplifier 610, the buffer circuit 620, and the inverter circuits 634 and 644 of the calibration circuits 630 and 640 are activated by an active EN signal. With the inverter circuits 634 and 644 of the calibration circuits 630 and 640 activated, and the pass gate circuits 632 and 642 still activated by the active CALIB signal, the voltage provided at the outputs of the inverter circuits 634 and 644 equalize at a voltage between the low logic level voltage and the high logic level voltage (e.g., one-half the voltage difference between VSS and VCC). The resulting voltage at the output of the inverter circuit 634 is provided to the output of the differential amplifier 610 and the resulting voltage at the output of the inverter circuit 644 is provided to the output of the buffer circuit 620.

At time T4, the pass gate circuits 632 and 642 are deactivated by the CALIB signal becoming inactive to decouple the inputs and outputs of the inverter circuits 634 and 644. The precharge circuit is deactivated by the inactive WRITE signal to decouple the sense line DL from the WRITEVAL voltage. Following the deactivation of the pass gate circuits 632 and 642 and the precharge circuit at time T4, the access line WL is activated thereby activating the memory cell MC for access. Upon activation of the memory cell MC, the voltage at the second input of the differential amplifier 610 is changed by the voltage corresponding to the data stored by the memory cell MC. At time T4, the memory cell MC accessed stores a "1" logic level, corresponding to voltage greater than the WRITEVAL precharge voltage. As a result, the activated memory cell MC causes the voltage at the second input of the differential amplifier 610 (i.e., the MINUS signal) to increase, as shown in FIG. 7 at time T4.

The increase in the voltage of the MINUS signal provided to the second input of the differential amplifier 610 causes the differential amplifier 610 to provide a complementary OUT-DIFF signal having a decreasing voltage. The decreasing voltage of the OUTDIFF signal causes the activated buffer circuit 620 to provide a complementary SAOUT signal corresponding to a high logic level voltage, as shown in FIG. 7 between times T4 and T5. The resulting voltage provided by the activated buffer circuit 620 may be used to write back data to the activated memory cell MC for those embodiments of the disclosure where write back is necessary.

At time T5, the memory cell MC is deactivated by an inactive WL line and the pass gate circuits 632 and 642 are activated by an active CALEB signal. Also at time T5 the differential amplifier 610, the buffer circuit 620, and the inverter circuits 634 and 644 of the calibration circuits 630 and 640 are deactivated, and the pull-up circuit 650 is also activated by an inactive EN signal. The precharge circuit is also activated by an active WRITE signal to precharge the sense line DL to the WRITEVAL precharge voltage, and the first and second inputs of the differential amplifier 610 are coupled together to have the same voltage, which is the WRITEVAL precharge voltage of the sense line DL. As a result, following time T5, the sense amplifier 600 returns to the same condition as prior to time T3 previously described.

Figure 8:
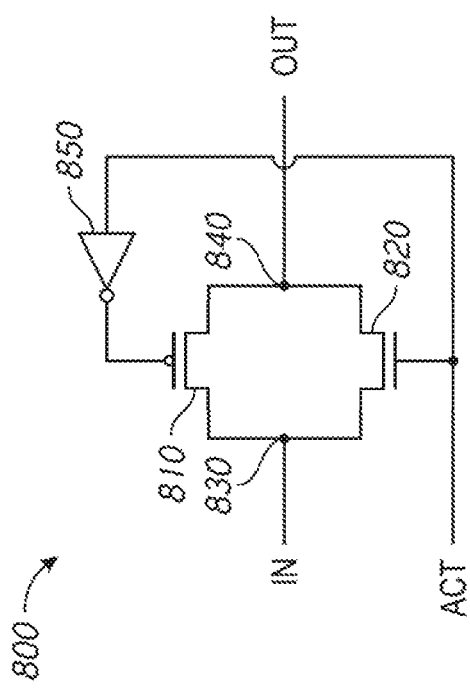
FIG. 8 is a schematic diagram of a pass gate circuit according to an embodiment of the disclosure.

FIG. 8 is a schematic diagram of a pass gate circuit 800 according to an embodiment of the disclosure. The pass gate 800 includes a first transistor 810 and a second transistor 820. The first transistor 810 is shown as a p-channel field effect transistor (pFET) and the second transistor 820 is shown as an n-channel field effect transistor (nFET) in FIG. 8. Sources and drains of the first and second transistors 810 and 820 are coupled to common nodes. An input signal IN is provided to a first common node 830 and an output signal is provided from a second common node 840. A gate of the second transistor 820 is provided an activation signal ACT and a gate of the first transistor 810 is provided the complement of the ACT signal, which is provided by an inverter circuit 850. In operation, the pass gate circuit 800 provides the IN signal as the OUT signal when activated by an active ACT signal (e.g., a high logic level ACT signal).

In some embodiments of the disclosure, the pass gate circuit 800 may be used for various ones of the pass gate circuits previously described. For example, the pass gate circuit 800 may be used as the pass gate circuit in the calibration circuit 225, the pass gate circuit 230, the pass gate circuit in the precharge circuit 240, the pass gate circuit 427, the pass gate circuit in the precharge circuit 440, and the pass gate circuits 632 and 642. The ACT signal may be provided by the CALIB signal, SAL2 signal, or WRITE signal corresponding to the particular use of the pass gate circuit 800.

Figure 9A:
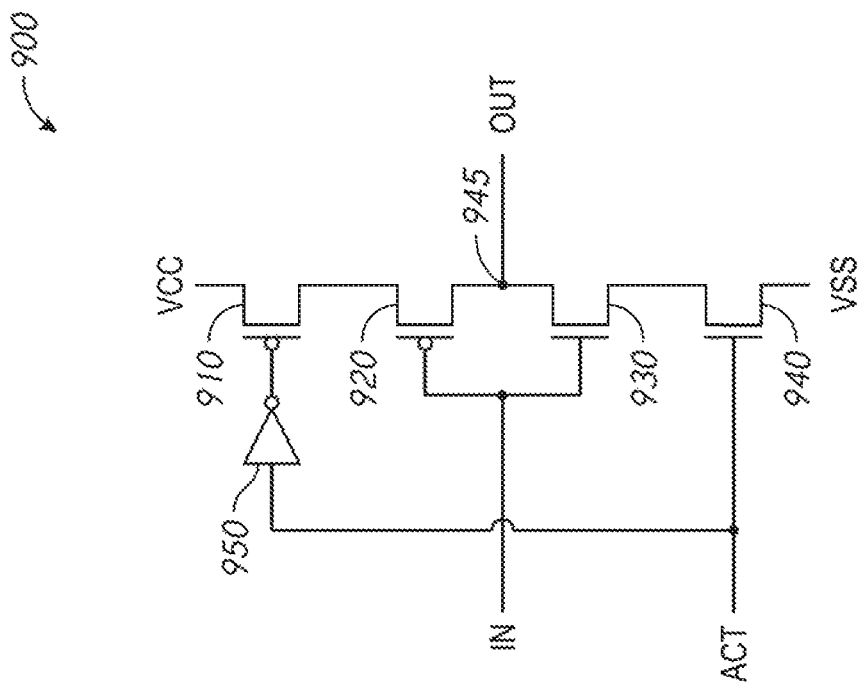
FIG. 9A is a schematic diagram of an inverter circuit according to an embodiment of the disclosure.

FIG. 9A is a schematic diagram of an inverter circuit 900 according to an embodiment of the disclosure. The inverter circuit 900 includes pFETs 910 and 920, and further includes nFETs 930 and 940. The pFET 920 and the NFET 930 are configured as an inverter and the pFET 910 and nFET 940 are configured to enable the inverter by providing the reference voltage VSS to the nFET 930 and providing the supply voltage VCC to the pFET 920 when activated by an active activation signal ACT and the complement of the ACT signal, which is provided by the inverter circuit 950. Gates of the pFET 920 and the nFET 930 are provided an input signal IN and an output signal OUT is provided from a common node 945 between the pFET 920 and the nFET 930. In operation, the inverter circuit 900 provides an OUT signal that is the complement of the IN signal when activated by an active ACT signal (e.g., logic high level).

In some embodiments of the disclosure, the inverter circuit 900 may be used for various ones of the inverter circuits previously described. For example, the inverter circuit 900 may be used as the inverter circuits 220, 420, and 429. The ACT signal may be provided by the SAL signal and the SALF signal corresponding to the particular use of the inverter circuit 900.

Figure 9B:
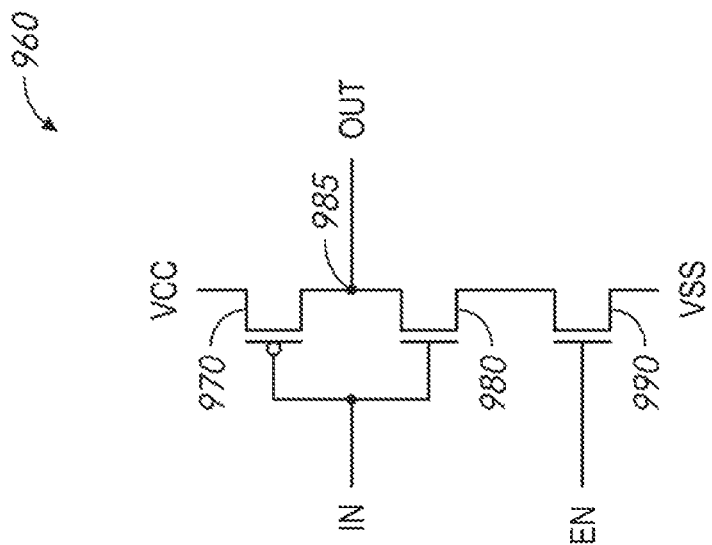
FIG. 9B is a schematic diagram of an inverter circuit according to an embodiment of the disclosure.

FIG. 9B is a schematic diagram of an inverter circuit 960 according to an embodiment of the disclosure. The inverter circuit 960 includes a pFET 970, an nFET 980 and an nFET 990. The pFET 970 and the nFET 980 are configured as an inverter, and the nFET 990 is configured to enable the inverter by providing the reference voltage VSS to the nFET 980 when activate by an enable signal EN. Gates of the pFET 970 and the nFET 980 are provided an input signal IN and an output signal OUT is provided from a common node 985 between the pFET 970 and the nFET 980. In operation, the inverter circuit 960 provides an OUT signal that is the complement of the IN signal when activated by an active EN signal (e.g., logic high level).

In some embodiments of the disclosure, the inverter circuit 960 may be used for various ones of the inverter circuits previously described. For example, the inverter circuit 960 may be used as the inverter circuits 620 and 634. The EN signal may be provided by the EN signal corresponding to the particular use of the inverter circuit 960.

Figure 10:
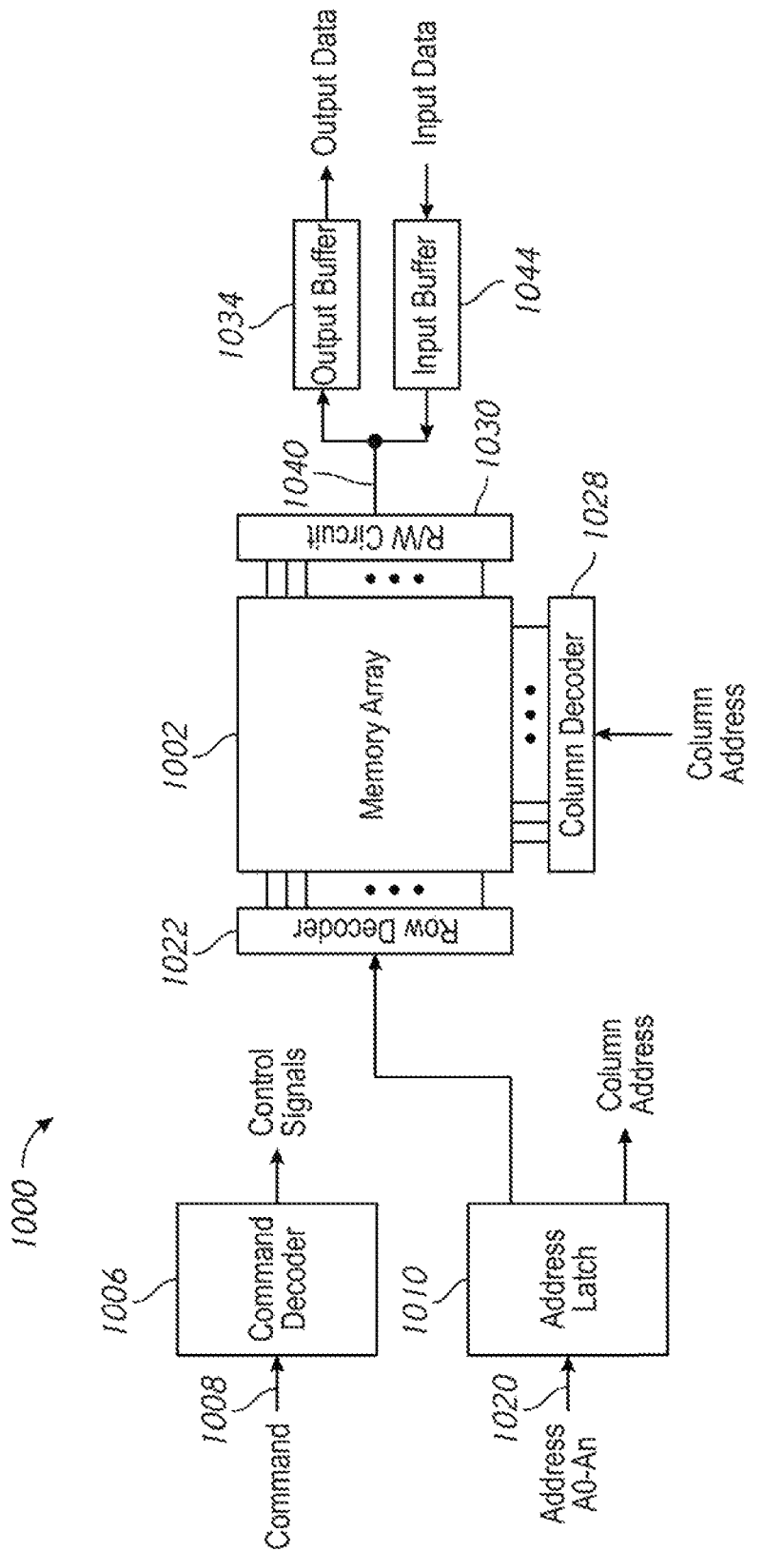
FIG. 10 is a block diagram of a memory including a sense amplifier according to an embodiment of the disclosure.

FIG. 10 is a block diagram of a memory 1000 including a sense amplifier according to an embodiment of the disclosure. The memory 1000 includes a memory array 1002 of memory cells, which may be, for example, volatile memory cells (e.g., DRAM memory cells, SRAM memory cells, etc.), non-volatile memory cells (e.g., ferroelectric memory cells, flash memory cells, PCM cells, etc.), or some other types of memory cells. The memory array 1002 may be implemented by the memory array 110 of FIG. 1, and include sense lines DL coupled to sense amplifiers according to an embodiment of the disclosure.

The memory 1000 includes a command decoder 1006 that receives memory commands through a command bus 1008 and generates corresponding control signals within the memory 1000 to carry out various memory operations. The command decoder 1006 responds to memory commands applied to the command bus 1008 to perform various operations on the memory array 1002. For example, the command decoder 1006 is used to generate internal control signals to read data from and write data to the memory array 1002. Row and column address signals are applied to the memory 1000 through an address bus 1020 and provided to an address latch 1010. The address latch then outputs a separate column address and a separate row address.

The row and column addresses are provided by the address latch 1010 to a row address decoder 1022 and a column address decoder 1028, respectively. The column address decoder 1028 selects bit lines extending through the memory array 1002 corresponding to respective column addresses. The row address decoder 1022 includes word line drivers that activate respective rows of memory cells in the memory array 1002 corresponding to received row addresses. The selected data line (e.g., a bit line or bit lines) corresponding to a received column address are coupled to a read/write circuitry 1030 to provide read data to a data output buffer 1034 via an input-output data bus 1040. Write data are applied to the memory array 1002 through a data input buffer 1044 and the memory array read/write circuitry 1030.

From the foregoing it will be appreciated that, although specific embodiments the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
an amplifier circuit having an input and an output and configured to be coupled to a supply voltage and a reference voltage, when activated the amplifier circuit configured to provide an output signal at the output that is complementary to an input signal provided to the input; and
a calibration circuit coupled to the output of the amplifier circuit, when activated by a calibration signal the calibration circuit configured to provide a calibration voltage to the output of the amplifier circuit, wherein the calibration voltage is an equilibration voltage between the supply voltage and the reference voltage provided to the amplifier circuit, wherein the calibration circuit comprises:
an inverter circuit configured to be coupled to a supply voltage and a reference voltage, the inverter circuit having an inverter input and an inverter output, wherein the inverter output is coupled to the output of the amplifier;
a capacitor coupled to the input of the inverter circuit; and
a pass gate circuit configured to couple the inverter output to the inverter input responsive to a calibration signal.

2. The apparatus of claim 1 wherein the amplifier circuit comprises:
an inverter circuit.

3. The apparatus of claim 1, further comprising:
a capacitor coupled between the input of the amplifier circuit and a sense line.

4. The apparatus of claim 3, further comprising:
a pass gate circuit configured to couple the input of the amplifier circuit to the sense line when activated.

5. The apparatus of claim 1 wherein the calibration circuit comprises:
a pass gate circuit configured to couple the output of the amplifier circuit to the input of the amplifier circuit when activated by an active calibration signal.

6. The apparatus of claim 5, further comprising:
a buffer circuit having an input coupled to the output of the amplifier circuit and further having a buffer output, the buffer circuit configured to provide a buffer output signal at the buffer output responsive to the output signal from the amplifier circuit, wherein the buffer output signal is the complement of the output signal from the amplifier circuit.

7. The apparatus of claim 1 wherein the amplifier circuit comprises:
a second inverter circuit.

8. The apparatus of claim 7, further comprising:
a second pass gate circuit configured to provide a precharge voltage to an input of the second inverter circuit when activated by an active precharge signal,
wherein the calibration circuit is activated to provide the calibration voltage to an output of the second inverter circuit during activation of the second pass gate circuit to provide the precharge voltage to the input of the second inverter circuit.

9. The apparatus of claim 1 wherein the amplifier circuit comprises:
a differential amplifier having a first input and a second input.

10. The apparatus of claim 9 wherein the first input and the second input are configured to be coupled together during activation of the calibration circuit to provide the calibration voltage to an output of the differential amplifier.

11. An apparatus, comprising:
an inverter circuit having an inverter input and an inverter output;
a pass gate circuit configured to couple the inverter output to the inverter input;
a capacitor coupled to the inverter input; and
an amplifier circuit having an amplifier input and an amplifier output,
wherein the inverter output is coupled to the amplifier output.

12. The apparatus of claim 11, further comprising:
a sense line coupled to the capacitor, the sense line configured to provide a voltage to the capacitor to be sensed by the inverter circuit.

13. The apparatus of claim 11, further comprising:
a buffer circuit coupled to the amplifier output.

14. The apparatus of claim 11 wherein the amplifier circuit comprises:
a second inverter circuit.

15. The apparatus of claim 11 wherein the amplifier circuit comprises:
a differential amplifier.

16. An apparatus, comprising:
a differential amplifier having first and second inputs and an output, the differential amplifier configured to provide an output signal at the output responsive to first and second input signals provided to the first and second inputs, respectively, wherein the output signal having a voltage based on a voltage difference between a first voltage of the first input signal and a second voltage of the second input signal;
a buffer circuit having an input coupled to the output of the differential amplifier and further having an output, the buffer circuit configured to provide an output signal that is the complement of the output signal from the differential amplifier;
a first calibration circuit coupled to the output of the differential amplifier, the first calibration circuit configured to provide a first calibration voltage to the output of the differential amplifier prior to the differential amplifier providing the output signal responsive to the first and second input signals; and
a second calibration circuit coupled to the output of the buffer circuit, the second calibration circuit configured to provide a second calibration voltage to the output of the buffer circuit prior to the buffer circuit providing the output signal that is the complement of the output signal from the differential amplifier,
wherein the first calibration voltage provided by the first calibration circuit provides offset cancellation for the amplifier circuit and the second calibration voltage provided by the second calibration circuit provides offset cancellation for the buffer circuit.

17. The apparatus of claim 16 wherein the first calibration circuit comprises:
an inverter circuit having an inverter input and an inverter output;

a pass gate circuit configured to couple the inverter output and the inverter input to provide the first calibration voltage when activated by an active calibration signal; and a capacitor coupled to the inverter input.

18. The apparatus of claim 17 wherein the inverter circuit is configured to be provided a supply voltage and a reference voltage and wherein the first calibration voltage is an equilibration voltage between the supply voltage and the reference voltage.

19. The apparatus of claim 17 wherein the second calibration circuit is configured the same as the first calibration circuit.

\* \* \* \* \*